United States Patent
Pettitt et al.

(10) Patent No.: US 7,543,632 B2
(45) Date of Patent: Jun. 9, 2009

(54) COMPACT CIRCUIT BOARD FOR AN AUTOMOTIVE HVAC SYSTEM

(75) Inventors: Edward Douglas Pettitt, Burt, NY (US); Jeffrey Charles Kinmartin, East Amherst, NY (US)

(73) Assignee: Delphi Technologies, Inc., Troy, MI (US)

( * ) Notice: Subject to any disclaimer, the term of this patent is extended or adjusted under 35 U.S.C. 154(b) by 706 days.

(21) Appl. No.: 11/328,290

(22) Filed: Jan. 9, 2006

(65) Prior Publication Data

US 2007/0161286 A1    Jul. 12, 2007

(51) Int. Cl.
*B60H 1/00* (2006.01)
(52) U.S. Cl. .................. 165/202; 165/42; 338/50; 338/51; 338/53; 338/57; 338/322
(58) Field of Classification Search ............... 165/41, 165/42, 43, 44, 202, 203, 204; 338/50, 51, 338/53, 57, 322, 325
See application file for complete search history.

(56) References Cited

U.S. PATENT DOCUMENTS

| | | | |
|---|---|---|---|
| 3,766,439 A | 10/1973 | Isaacson | |
| 4,781,601 A | 11/1988 | Kuhl et al. | |
| 4,843,520 A | 6/1989 | Nakatani et al. | |
| 4,935,717 A * | 6/1990 | Osawa et al. | ............ 338/51 |
| D340,223 S | 10/1993 | Nitta | ............ D13/125 |
| 5,268,665 A | 12/1993 | Iwao | ............ 338/22 R |
| 5,408,575 A * | 4/1995 | Morris | ............ 338/325 |
| 5,703,561 A * | 12/1997 | Yamamoto et al. | ............ 338/53 |
| 6,333,710 B1 | 12/2001 | Reiche et al. | |
| 6,747,542 B1 * | 6/2004 | Hoehn | ............ 338/50 |

FOREIGN PATENT DOCUMENTS

| | | |
|---|---|---|
| CN | 583 499 | 12/1976 |
| EP | 1 014 580 | 6/2000 |

OTHER PUBLICATIONS

European Search Report dated Apr. 25, 2007.

* cited by examiner

*Primary Examiner*—Ljiljana (Lil) V Ciric
(74) *Attorney, Agent, or Firm*—Patrick M. Griffin

(57) ABSTRACT

An automotive heat, ventilation and air conditioning (HVAC) system including an electrical control module for controlling the motor of the system. The module includes a connector base supporting a circuit board having spaced side edges extending into the housing. The circuit board having a first leg extending from the base and through a curved section and into a second leg to a distal end spaced from the base with an electrical circuit extending over the exterior of the first leg and over the curved section and over the second leg. The circuit board includes an offset section between the base and the first leg for centralizing the legs on the base.

12 Claims, 3 Drawing Sheets

COMPACT CIRCUIT BOARD FOR AN AUTOMOTIVE HVAC SYSTEM

BACKGROUND OF THE INVENTION

1. Field of the Invention

An automotive heat, ventilation and air conditioning (HVAC) system including an electrical control module having a circuit board in the air flow.

2. Description of the Prior Art

The electrical control module employed in HVAC systems are usually resistor devices for controlling the blower motor and are disposed so as to extend into an air passage defined by housing, the blower motor being supported in the housing. The electrical control module comprises a base supported by the housing and a circuit board having spaced side edges and extends into the housing from the base. An electrical circuit is disposed on the circuit board for controlling the motor. Such an electrical control module is shown in U.S. Pat Nos. 5,268,665 to Iwao and Des. 340,223 to Nitta et al.

The known electrical control modules typically include a screen-printed resistance circuit on a rectangular shaped circuit board. The circuit board is disposed in the air flow path in a passage in the HVAC housing to dissipate heat and, sometimes, whistles and noises are generated by the air moving over the circuit board. In addition, the length of the rectangular shape to achieve the circuit lengths increases packaging space thereby increasing shipping expenses.

SUMMARY OF THE INVENTION AND ADVANTAGES

The invention provides for the circuit board having a first leg extending from the base and through a curved section and into a second leg to a distal end with the electrical circuit extending over the first leg and over the curved section and over the second leg.

Accordingly, the circuit board of the subject invention can be packed more densely to reduce shipping expense and can be shaped to minimize air flow generated noises.

BRIEF DESCRIPTION OF THE DRAWINGS

Other advantages of the present invention will be readily appreciated, as the same becomes better understood by reference to the following detailed description when considered in connection with the accompanying drawings wherein.

DETAILED DESCRIPTION OF THE INVENTION

Figure 1:
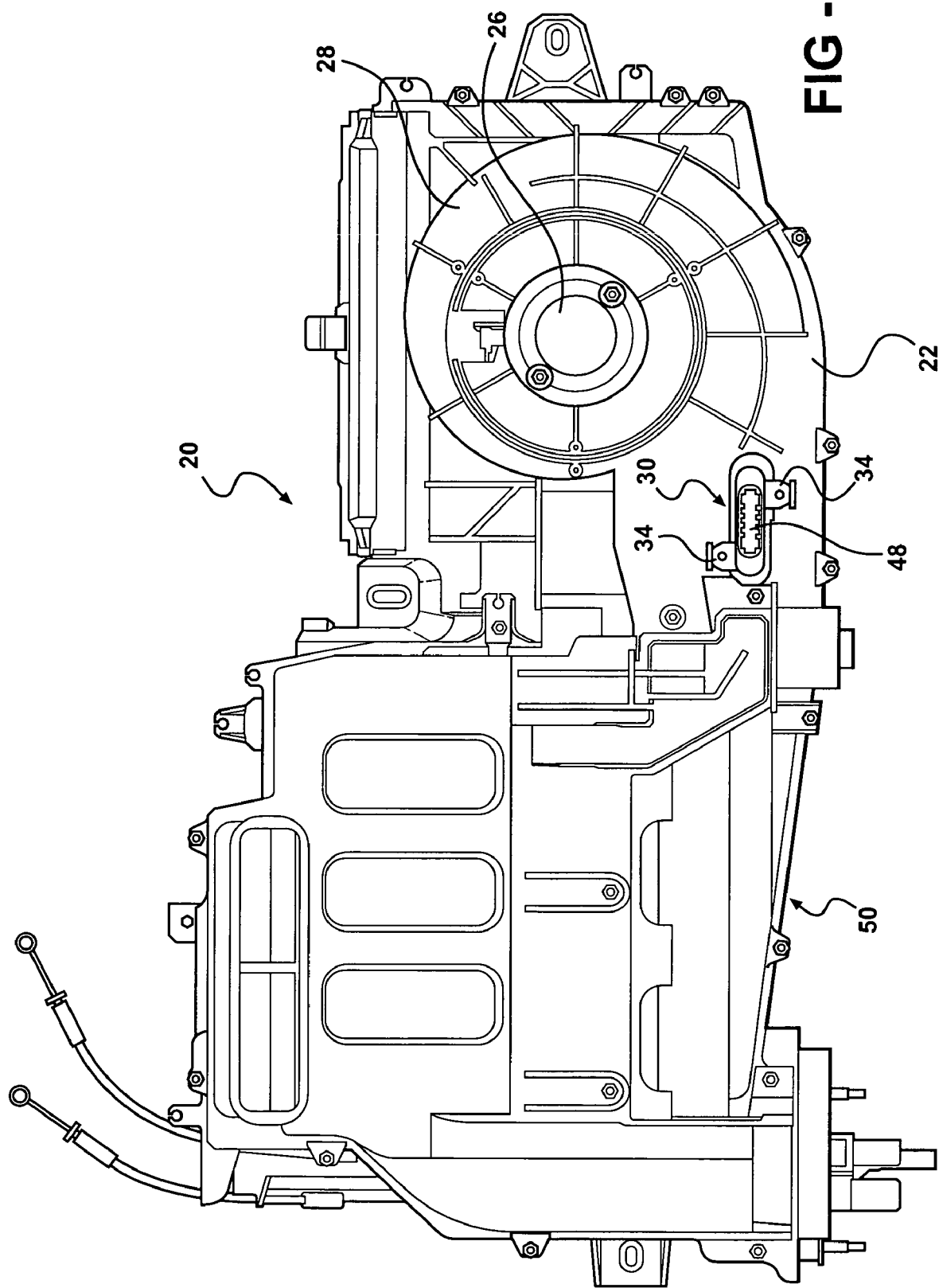
FIG. 1 is a bottom view of a HVAC system showing the electrical control module.
Figure 2:
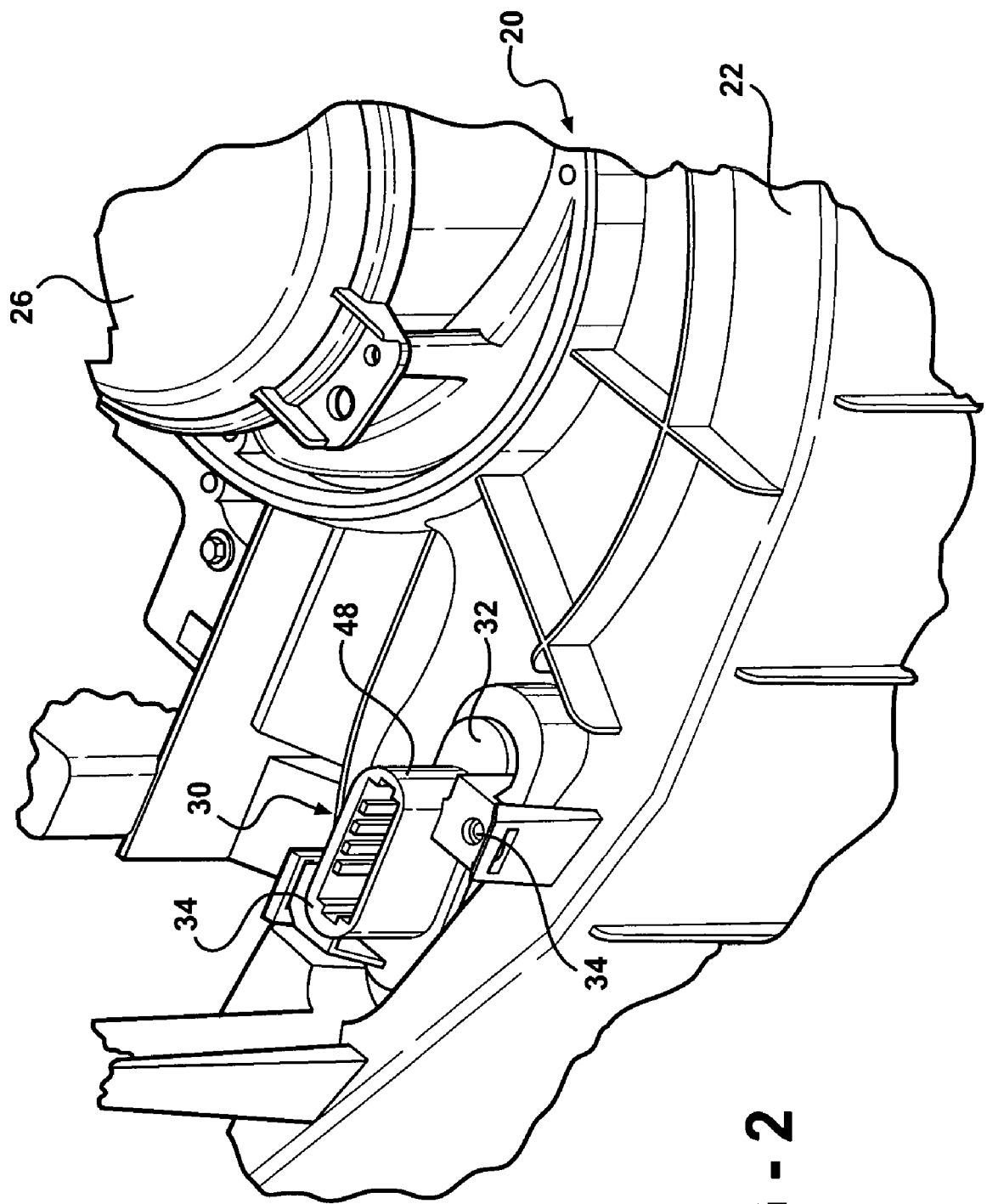
FIG. 2 is an enlarged fragmentary perspective view of the HVAC system showing the electrical control module.
Figure 3:
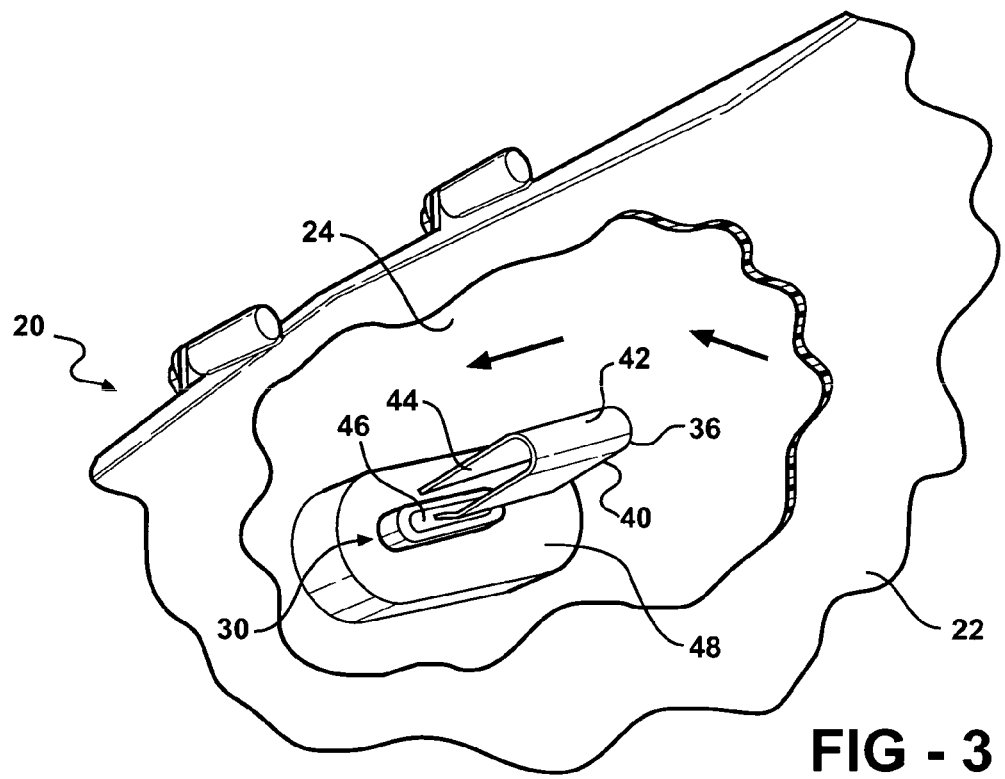
FIG. 3 is an enlarged fragmentary view showing the electrical control module supported by the housing in the air flow path.
Figure 4:
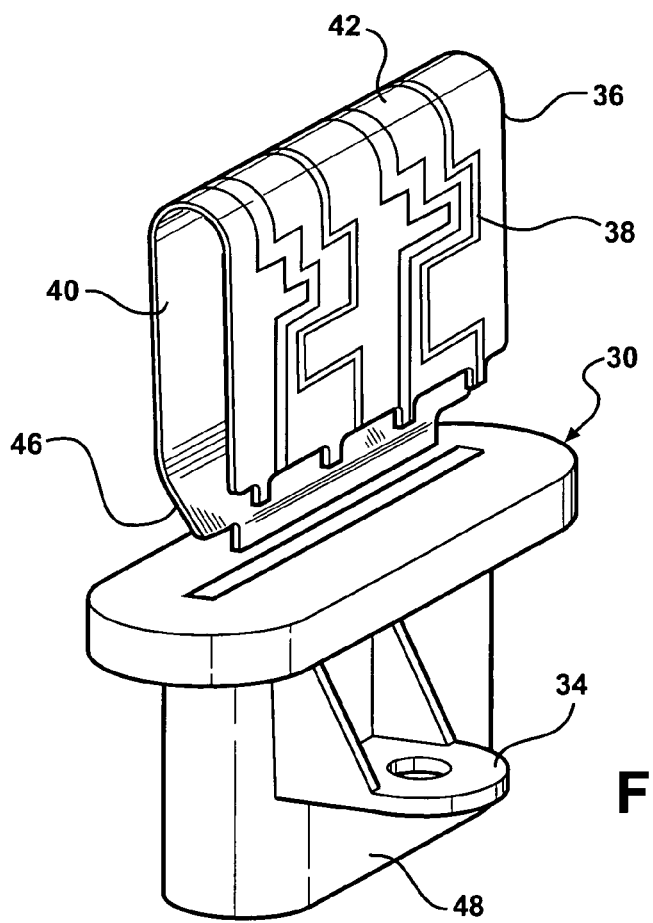
FIG. 4 is a perspective view of the electrical control module.

Referring to the Figures, wherein like numerals indicate corresponding parts throughout the several views, an automotive heat, ventilation and air conditioning (HVAC) system 20 is generally shown and includes a housing 22 defining an air passage 24, as shown in FIG. 3. A motor 26 is supported in the housing 22 and drives a blower for blowing air in a flow path along the passage 24 defining a scroll 28.

The system 20 includes an electrical control module 30 generally indicated. The module 30 includes a base 32 supported by the housing 22 with attachments 34 for removably attaching the base 32 to the housing 22. More specifically, as illustrated, the attachments 34 comprise flanges through which fasteners extend for securing the module 30 to the housing 22. The attachments 34 may also comprise mechanical snap-together connectors.

A circuit board 36, having spaced side edges, and extends into the housing 22 from the base 32 and an electrical circuit 38 is disposed on the circuit board 36 for controlling the motor 26, the electrical circuit 38 being a resistance circuit. The electrical circuit 38 over the curved surface is applied by a micro-pen resistive ink depositing process.

The invention is distinguished by the circuit board 36 having a first leg 40 extending from the base 32 and through a curved section 42 and into a second leg 44 to a distal end spaced from the base 32. The electrical circuit 38 extends over the first leg 40 and over the curved section 42 and over the second leg 44. More specifically, the circuit board 36 includes an interior surface and an exterior surface and the electrical circuit 38 is disposed on the exterior surface. In the preferred embodiment, the second leg 44 is substantially parallel to the first leg 40 and the circuit board 36 includes an offset section 46 between the base 32 and the first leg 40 for centralizing the legs 40, 44 on the base 32.

The base 32 includes an electrical connector 48 for connection to an electrical plug. The electrical connector 48 is illustrated as a female socket having male prongs for receiving a male plug having female prong openings.

A heat exchanger is supported in a portion 50 of the housing 22 for receiving air from the passage 24 and the circuit board 36 is disposed in the passage 24 with the side edges aligned with the flow path, as best shown in FIG. 3.

Obviously, many modifications and variations of the present invention are possible in light of the above teachings. The invention may be practiced otherwise than as specifically described within the scope of the appended claims

What is claimed is:

1. An automotive heat, ventilation and air conditioning (HVAC) system comprising;
   a housing defining an air passage,
   a blower motor supported in said housing,
   a base supported by said housing,
   a circuit board having spaced side edges and extending into said housing from said base,
   an electrical circuit disposed on said circuit board for controlling said motor,
   said circuit board having a first leg extending from said base and through a curved section and into a second leg to a distal end, said electrical circuit extending over said first leg and over said curved section and over said second leg wherein said circuit board includes an offset section between said base and said first leg for centralizing said legs on said base.

2. The system as set forth in claim 1 wherein said circuit board includes an interior surface and an exterior surface and said electrical circuit is disposed on said exterior surface.

3. The system as set forth in claim 1 wherein said second leg is substantially parallel to said first leg.

4. The system as set forth in claim 1 including a blower for blowing air in a flow path along said passage, said circuit board disposed in said passage with said side edges aligned with said flow path.

5. The system as set forth in claim 1 wherein said base includes an electrical connector for connection to an electrical plug.

6. The system as set forth in claim 1 wherein said base includes attachments for removably attaching said base to said housing.

7. The system as set forth in claim 1 including a heat exchanger supported in said housing for receiving air from said passage.

8. An electrical control module comprising;

a base, a circuit board having spaced side edges and extending from said base, an electrical circuit disposed on said circuit board, said circuit board having a first leg extending from said base and through a curved section and into a second leg to a distal end, said electrical circuit extending over said first leg and over said curved section and over said second leg wherein said circuit board includes an offset section between said base and said first leg for centralizing said legs on said base.

9. The module as set forth in claim 8 wherein said circuit board includes an interior surface and an exterior surface and said electrical circuit is disposed on said exterior surface.

10. The module as set forth in claim 8 wherein said second leg is substantially parallel to said first leg.

11. The module as set forth in claim 8 wherein said base includes an electrical connector for connection to an electrical plug.

12. The module as set forth in claim 11 wherein said base includes attachments for removably attaching said base to said housing.

* * * * *